US 008493231B2

(12) United States Patent (10) Patent No.: US 8,493,231 B2
Teachman (45) Date of Patent: Jul. 23, 2013

(54) POWER METER HAVING FAULT TOLERANCE

(75) Inventor: Michael E. Teachman, Victoria (CA)

(73) Assignee: Power Measurement Ltd., Saanichton, British Columbia ( * ) Notice: Subject to any disclaimer, the term of this patent is extended or adjusted under 35 U.S.C. 154(b) by 1439 days.

(21) Appl. No.: 11/851,554

(22) Filed: Sep. 7, 2007

(65) Prior Publication Data

US 2009/0066527 A1 Mar. 12, 2009

(51) Int. Cl.
*G08C 23/00* (2006.01)
*G08C 15/06* (2006.01)
*G08C 19/22* (2006.01)
*G08C 19/06* (2006.01)
*G01R 1/00* (2006.01)
*G01R 7/00* (2006.01)
*G01R 11/32* (2006.01)
*G01R 31/00* (2006.01)

(52) U.S. Cl.
USPC ............ 340/870.01; 340/870.02; 340/870.05; 340/870.07; 324/110; 324/142; 702/58

(58) Field of Classification Search
USPC ............. 340/870.02–870.03, 870.05–870.06, 340/3.1–3.9, 2.21, 2.24; 702/57–78; 324/76.11–157; 361/659, 661, 88, 93.1
See application file for complete search history.

(56) References Cited

U.S. PATENT DOCUMENTS

| 5,153,837 | A | * | 10/1992 | Shaffer et al. ................. 705/412 |
| 6,275,168 | B1 | * | 8/2001 | Slater et al. ............. 340/870.02 |
| 6,429,785 | B1 | | 8/2002 | Griffin et al. |
| 6,615,147 | B1 | | 9/2003 | Jonker et al. |
| 6,961,641 | B1 | | 11/2005 | Forth et al. |
| 7,158,050 | B2 | | 1/2007 | Lightbody et al. |
| 7,191,076 | B2 | | 3/2007 | Huber et al. |
| 7,249,265 | B2 | | 7/2007 | von Carolsfeld et al. |
| 7,251,570 | B2 | * | 7/2007 | Hancock et al. ................. 702/57 |
| 7,460,347 | B2 | * | 12/2008 | Schweitzer et al. ............ 361/62 |
| 2005/0270015 | A1 | * | 12/2005 | Hemminger et al. ......... 324/142 |
| 2007/0067119 | A1 | | 3/2007 | Loewen et al. |
| 2008/0052019 | A1 | * | 2/2008 | Brennan et al. ................. 702/64 |

OTHER PUBLICATIONS

"Principles of High Availability Embedded Systems Design," David Kalinsky, Ph.D., D. Kalinsky Associates — Training, ESC Silicon Valley 2007, Apr. 5, 2007, Class # ESC—414 & 434 (pp. 10).
Principles of High Availability Embedded Systems Design, David Kalinsky, Ph.D., D. Kalinsky Associates, Sunnyvale CA, ESC Silicon Valley 2007, Class # ESC—414 & 434, Thursday, Apr. 5, 2007. (Slides) (pp. 28).

\* cited by examiner

*Primary Examiner* — Brian Zimmerman
*Assistant Examiner* — Jerold Murphy
(74) *Attorney, Agent, or Firm* — Brinks Hofer Gilson & Lione

(57) ABSTRACT

A power meter having fault tolerance enhances the monitoring of electrical power by increasing the reliability of data output by the power meter having fault tolerance. The power meter having fault tolerance may enhance the monitoring process by transitioning from a faulty power monitoring device to a non-faulty power monitoring device without losing or corrupting power management data.

16 Claims, 9 Drawing Sheets

POWER METER HAVING FAULT TOLERANCE

BACKGROUND OF THE INVENTION

1. Technical Field

This application relates to a power meter and, more specifically, to a power meter having fault tolerance.

2. Related Art

Fault tolerance is generally regarded as the ability to mask, or recover from, erroneous conditions in a system once an error has been detected. Fault tolerance typically describes a computer system or component designed so that, in the event that a component fails, a backup component or procedure can take its place with substantially little or no loss of service.

Fault tolerance may be provided with software, hardware, or by some combination. In some software implementations, the operating system may provide an interface that allows a programmer to "checkpoint" critical data at pre-determined points or times. In some hardware implementations, the programmer does not need to be aware of the fault-tolerant capabilities of the machine. In some of these implementations, fault tolerance may be achieved through the use of redundant components. However, in some of these software and/or hardware implementations, if a primary device fails, a backup device may be unaware of the data previously processed by the primary device, and therefore discontinuities may exist between the data processed by the primary device and the data processed by the backup device.

BRIEF DESCRIPTION OF THE DRAWINGS

The technology may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

A power meter having fault tolerance enhances the monitoring of electrical power by increasing the reliability of data output by the power meter. The power meter having fault tolerance may enhance the monitoring process by transitioning from a faulty power monitoring device to a non-faulty power monitoring device without losing power management data. The power meter having fault tolerance may include a first power monitoring device and a second power monitoring device positioned within a housing. Both power monitoring devices may receive the same input data and may perform power management functions and/or reporting algorithms. The first power monitoring device may transmit power management data while the second power monitoring device transmits the power management data that is not transmitted by the first power monitoring device.

The monitoring of electrical powers especially the measuring and calculating of electrical parameters, provides valuable information for electrical energy providers and their customers. Monitoring of electrical power is important to ensure that the electrical power is effectively and efficiently generated, distributed, and utilized.

Figure 1:
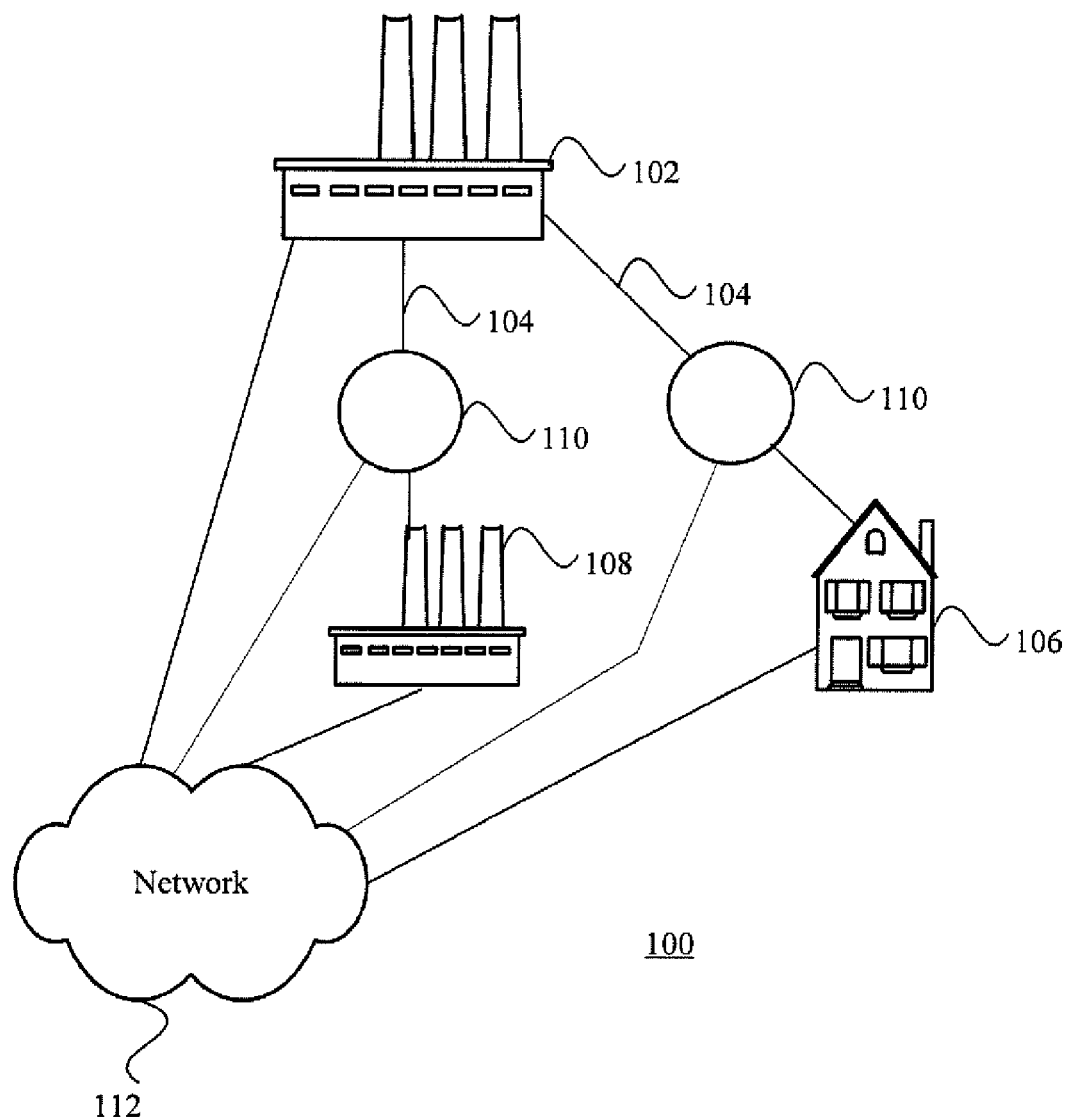
FIG. 1 is a block diagram of an electrical generation and distribution system.

FIG. 1 is a block diagram of an electrical generation and distribution system 100. An electrical provider 102 generates electrical energy that may be distributed to customers through a power distribution network. In some systems, the customers may include end-user consumers 106 and/or other utility providers 108. The power distribution network may include a network of transmission mediums that link the electrical provider 102 to its customers. In some systems, the transmission mediums may include electrical distribution wires 104. A power meter having fault tolerance 110 may be placed in-line with a transmission medium between the electrical provider 102 and the customer, and may be proximate to one or more loads which receive electrical energy from the electrical provider 102. The power meter having fault tolerance 110 may measure and/or monitor the amount of electrical energy flowing to the customer from the electrical provider 102 and/or other parameters. The power meter having fault tolerance 110 may perform various functions and/or reporting algorithms on the received electrical energy and/or parameters and may provide feedback to the electrical provider 102 through a network 112. In some systems, a connection to the network 112 is a hardwired or wireless connection, and may include an Internet connection. Communications through the network 112, allow for large scale data transmissions. Communications transmitted through the network 112 may include security features, such as encryption, time/date stamps, and/or power meter serial number authentication.

Figure 2:
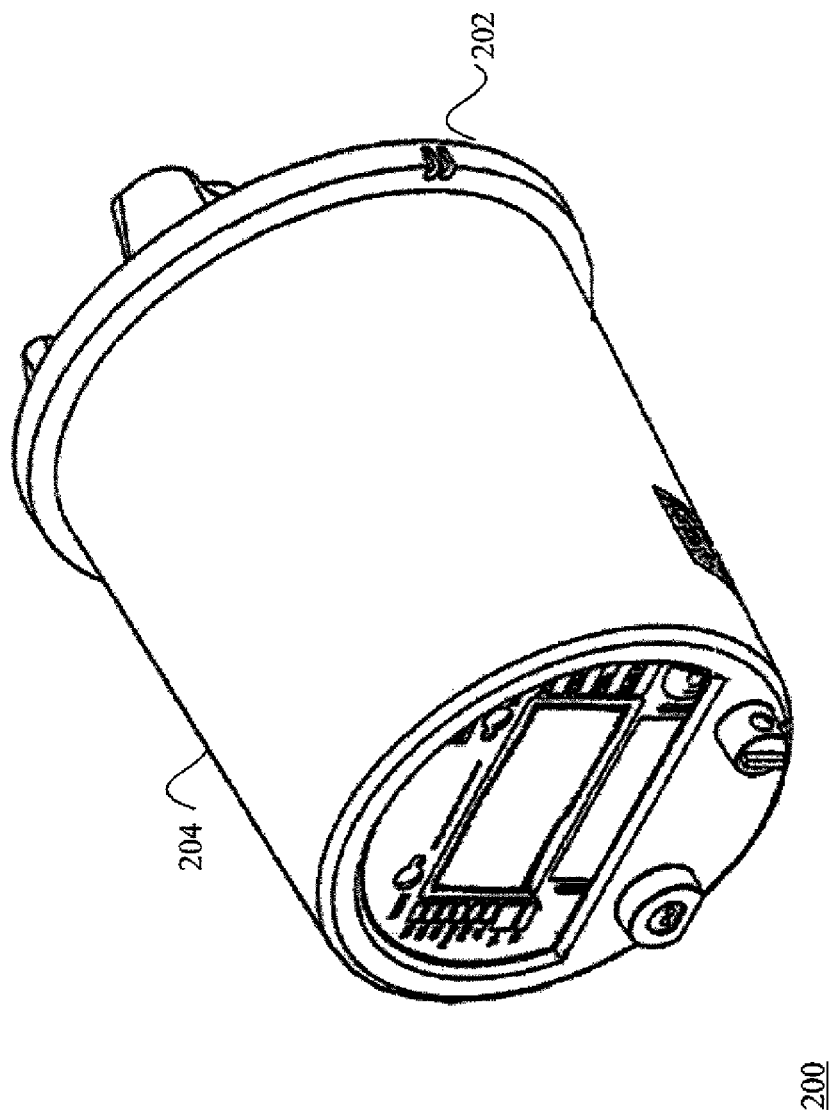
FIG. 2 is a power meter.

FIG. 2 is a power meter. FIG. 2 shows a socket based power meter 200 has a base 202 and a cover 204 that form a housing. The housing encloses the power meter's 200 electronics and may include a display. A sealing mechanism may secure the cover 204 to prevent unauthorized access to the meter electronics. Blade type terminals are disposed on the base 202 of the meter 200. The blades are designed to mate with matching jaws of a detachable meter mounting device such as a revenue meter socket.

Figure 3:
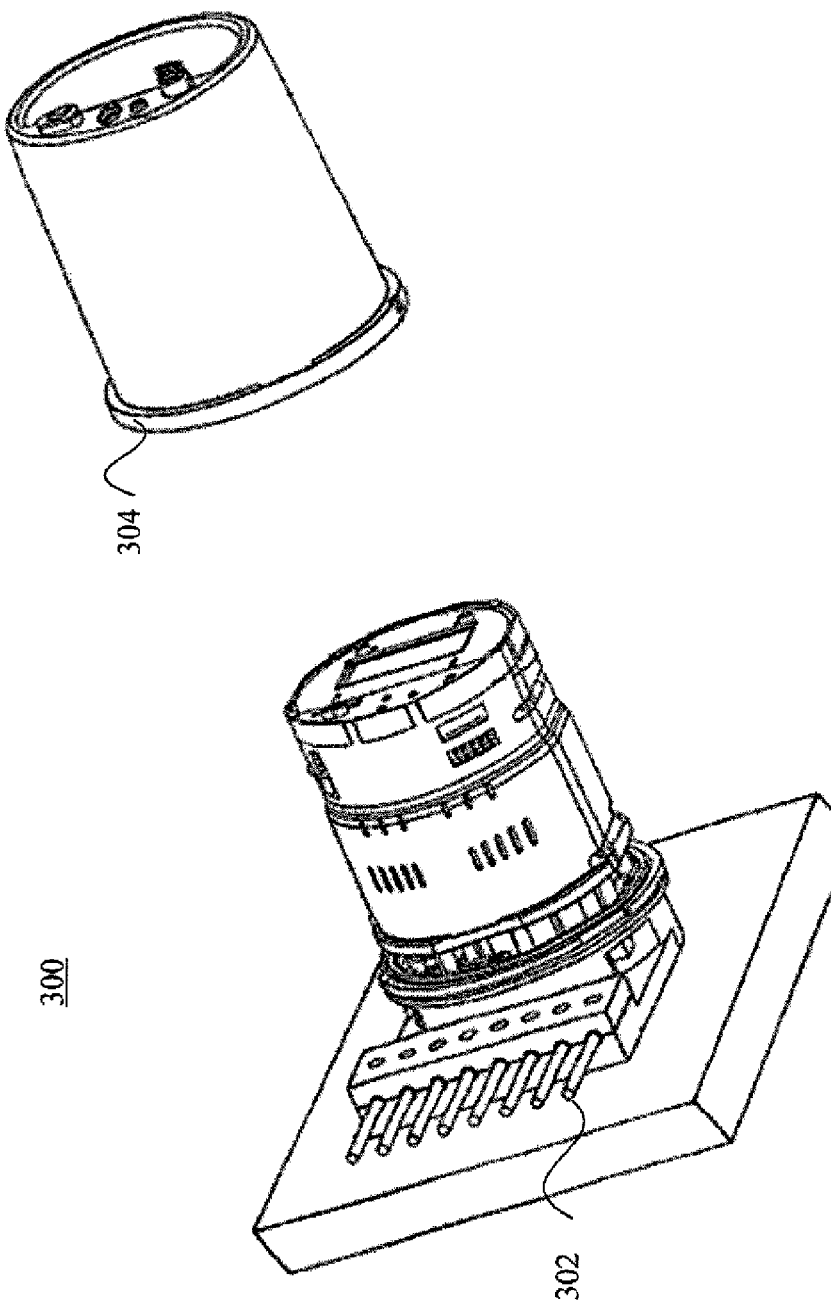
FIG. 3 is a second power meter.

FIG. 3 is a second power meter. In FIG. 3, a bottom connected power meter 300 has bottom connecting terminals 302. The terminals may be screw terminals for receiving the conductors of an electrical circuit. A bottom connected power meter 300 may be directly connected to the electrical circuit. A cover 304 may enclose the meter electronics and/or a display within a housing of the power meter 300. A seating mechanism may secure the cover 304 to prevent unauthorized access to the meter. Additionally, other types of power meters, such as "Switchboard," "Draw-Out," "Rack Mount," or "Panel Mount" meters may include fault tolerance.

Figure 4:
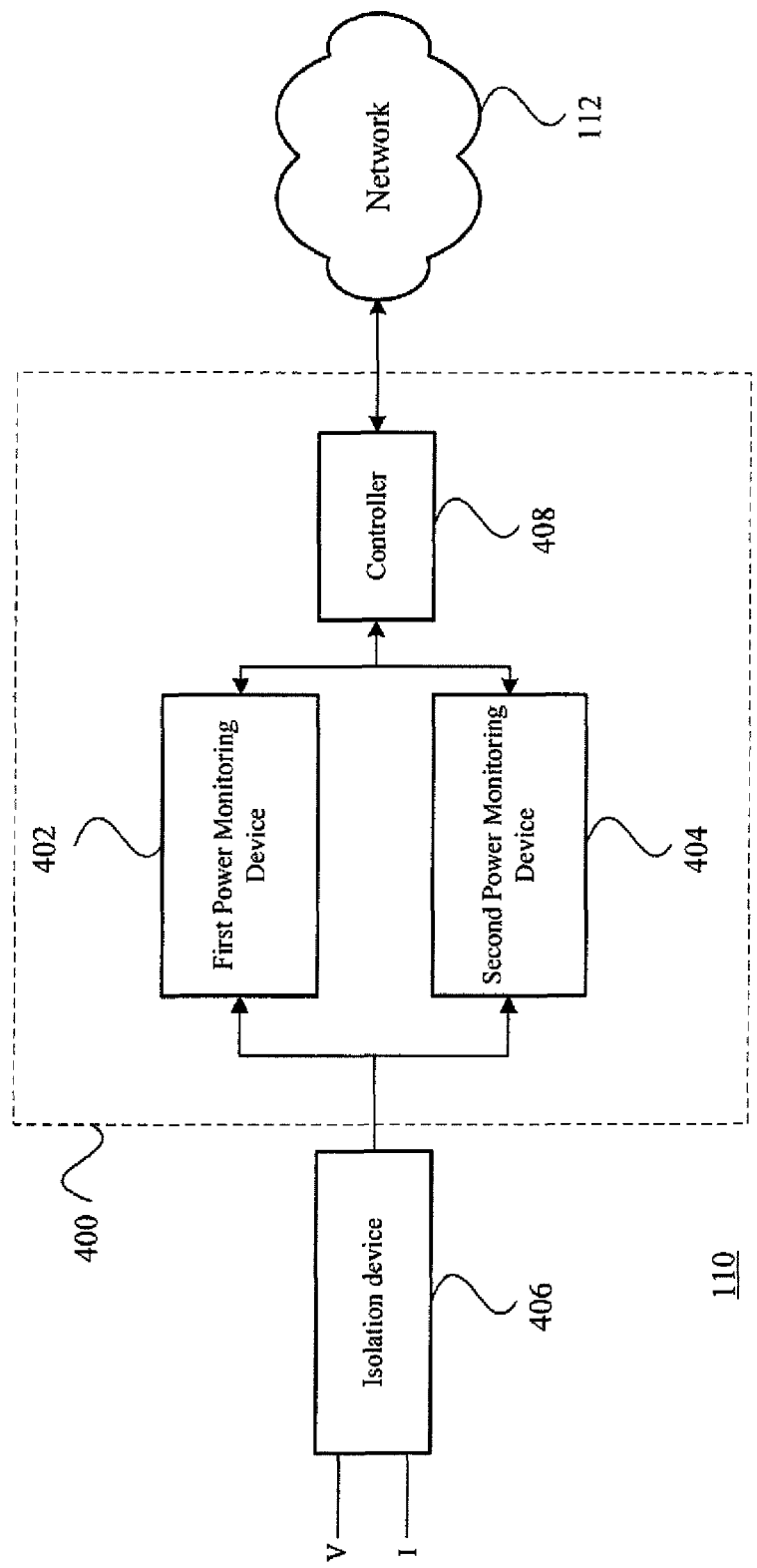
FIG. 4 is a block diagram of a power meter having fault tolerance.

FIG. 4 is a block diagram of a power meter having fault tolerance 110. The power meter having fault tolerance 110 receives electrical energy and/or parameters and may use this received information to detect, record, generate, and/or report power management data. The power meter having fault tolerance 110 includes a housing 400 that contains a first power monitoring device 402 and a second power monitoring device 404. In FIG. 4, an isolation device 406 isolates electrical energy, such as a voltage (V) and a current (I), from the first power monitoring device 402 and the second power monitoring device 404. The first power monitoring device 402 and the second power monitoring device 404 receive the isolated voltage and/or current waveform signals and perform one or more power management functions and/or reporting algorithms. Some power management functions may include voltage and current measurements, harmonic measurement, power factor, real power, reactive energy, apparent energy, reactive power, apparent power, frequency current demand, voltage demand, and/or other kWh or kW measurements. Some reporting algorithms may detect, monitor, report, quantify, and communicate power quality and/or revenue information relating to the monitored energy and/or parameters. Both the first power monitoring device 402 and the second power monitoring device 404 may perform the same power management functions and/or reporting algorithms.

A controller 408 may monitor the operational status of the first power monitoring device 402 and the second power monitoring device 404 and select an output from one of the power monitoring devices. In some implementations, when both of the power monitoring devices are in an operational state, software executed by the power monitoring devices and/or controller 408 may determine which power monitoring device's output is selected. Once a power monitoring device is selected (e.g., first power monitoring device 402), the controller 408 may cause an output of power management data processed by the selected power monitoring device to be transmitted to a network 112. If the selected power monitoring device does not transmit power management data, for example because it has suffered a fault or its data has been corrupted, the controller 408 may cause power management data processed at another power monitoring device (e.g., second power monitoring device 404) to be transmitted to the network 112. The initially unselected power monitoring device (e.g., the second power monitoring device 106) may perform the same power management functions and/or reporting algorithms as the selected power monitoring data, such that when a transition between monitoring devices occurs, the power meter having fault tolerance may continue to provide power management data with substantially no loss or corruption of power management data. Alternatively, the first power monitoring device 402 and the second power monitoring device 404 may perform different algorithms that are selected to achieve the same result. The use of separate algorithms may provide additional fault tolerance. This additional fault tolerance may provide protection where an algorithm was incorrectly programmed or there is a fault in a memory location or a shared resource used by a particular power management function and/or reporting algorithm.

In addition to controlling the power monitoring device output, the controller may be programmed to perform rescue operations on a faulty power monitoring device. In some applications, a controller may automatically, or after a determined period of time, attempt to diagnose and/or reboot a faulty power monitoring device or any devices that make up the power monitoring device.

Figure 5:
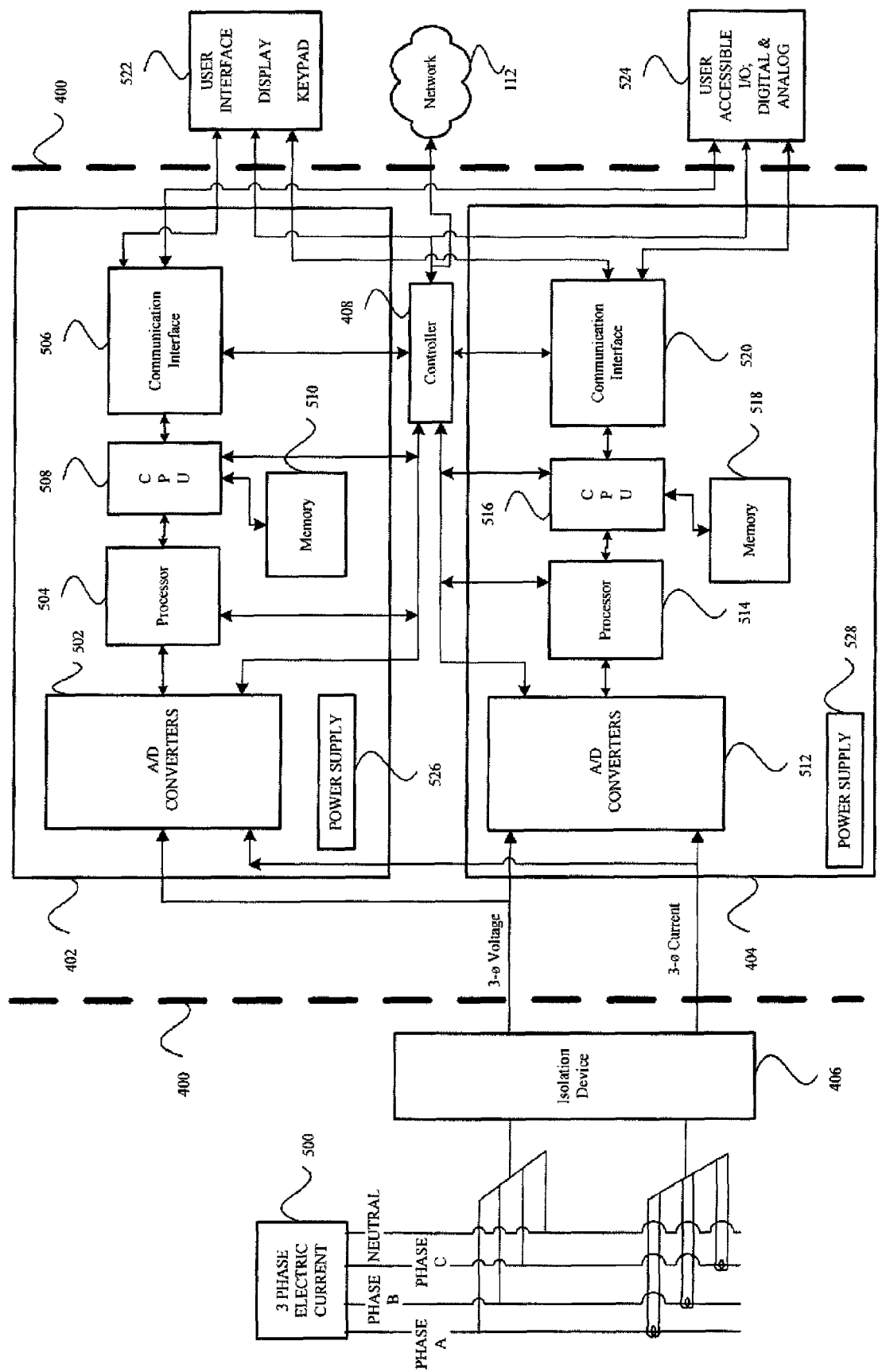
FIG. 5 is a second block diagram of the power meter having fault tolerance of FIG. 4.

FIG. 5 is a second block diagram of the power meter having fault tolerance of FIG. 4. FIG. 5 shows a power meter having fault tolerance connected to a three phase electrical circuit 500. Alternatively, the power meter having fault tolerance may use other circuit connection configurations, such as single-phase circuitry, other polyphase circuitry, or a direct current circuitry. The isolation circuit 406 may sense the current (I) and voltage (V) in each phase of the electrical circuit 500. In some systems, the isolation circuit 406 may include transducers which may sense the current and/or voltage in each phase of the electrical circuit 500. The isolation circuit output may be supplied to the first power monitoring device 402 and the second power monitoring device 404 through common lines.

In the first power monitoring device 402, an analog-to-digital ("A/D") converter 502 receives the isolation circuit output. As used herein, the term A/D converter refers not only to a traditional A/D converter but also to a Time Division Multiplexing ("TDM") based converter, or other converter which converts analog signals to digital signals. TDM is a method of measuring instantaneous power over a wide range of input voltages. TDM is accomplished by taking a snapshot of the waveform of the incoming electrical signal and converting it to a square wave over time using a known algorithm. The area of this square wave is then proportional to the power at the time the snap shot was acquired. The snapshot or sample time may be dependent on processor speed.

The A/D converter 502 may sample the current and voltage in each phase of the electrical circuit 500 and generate digital samples. A processor 504 receives the digital samples. The processor 504, in conjunction with a central processing unit ("CPU") 508, or other processor, and memory 510, may execute power management functions and/or reporting algorithms. These functions and/or algorithms may operate on some or all of the samples provided. In some implementations, the processor 504 processes 64 samples per half cycle. In other implementation, more or less samples may be processed by the processor 504.

The CPU 508 is also connected to a communications interface 506 that provides connectivity to the network 112. The communications interface 506 may include one or more communication ports. In some implementations, the communication ports may be an Ethernet port, a serial port, and/or a wireless port, such as an infrared or cellular interface. The network 112 may be a publicly accessible data network such as the Internet or other network or combination of sub-networks that transmit data. The network 112 may receive/transmit data using the transport control protocol/internet protocol ("TCP/IP") protocol suite. The network 112 may include private internet networks, virtual private networks, extranets or combinations thereof and combinations which include the Internet. Alternatively, other communications network architectures may be implemented. Power supply 526 may supply power to the first power monitoring device 402.

In the second power monitoring device 404, an A/D converter 512 receives the isolation circuit output. The A/D converter 512 may sample the current and voltage in each phase of the electrical circuit 200 and generate digital samples. A processor 514 receives the digital samples from the A/D converter 512. The processor 514, in conjunction with a CPU 516, or other processor, and a memory 518, may execute the same power management functions and/or reporting algorithms as the first power monitoring device processor 402. These functions and/or algorithms may operate on some or all of the samples provided. In some implementations, the processor 514 processes 64 samples per half cycle. In other implementations, the processor 514 processes more or less samples.

The CPU 516 is also connected to a communications interface 520 that provides connectivity to the network 112. The communications interface 520 may include one or more communication ports. In some implementations, the communication ports may be an Ethernet port, a serial port, and/or a wireless port, such as an infrared or cellular interface. Power supply 528 may supply power to the second power monitoring device 404.

The controller 408 may be powered by the first power monitoring device power supply 526 or the second power monitoring device power supply 528. Alternatively, the controller 408 may be powered by a power supply external to either of the first power monitoring device 402 or the second power monitoring device 404.

A user may program the fault tolerant meter 110, retrieve revenue data or power management data, and generally interact with the fault tolerant meter 110 through a user interface 522. The user interface 522 may be connected to the controller 408 such that information may be received from or transmitted to the selected power monitoring device. The user interface 522 may include a graphical display and a keypad, as well as light emitting diodes ("LEDs"), and/or infrared and optical interfaces. Information which may be provided through the user interface includes event logs, textual information, owner, power meter, power system details, and other power meter related parameters. Additionally, the user interface 522 may display information representing the operational state of one or more power monitoring devices. The controller 408 may prevent some or all of the data transmitted by a communications interface (e.g., 506, 520) that is part of a non-selected power monitoring device from being accessible through the user interface 522.

In some implementations, the one or more communication ports of each communications interface 506 and 520 receive digital and/or analog data transmitted across the network 112. Alternatively, the one or more communication ports of each communications interface 506 and 520 may receive digital and/or analog data transmitted by a user, such as a technician, through a user accessible digital/analog input/output 524. In these implementations, a user may directly communicate with the communications interface 506 and/or 520 and bypass the user interface 522.

The controller 408 may detect a fault of a power monitoring device by analyzing the power management data it receives from a power monitoring device. Through data analysis, such as data error checking, the controller 408 may determine whether any of the power management data received has been corrupted and whether a fault has occurred at a power monitoring device. Alternatively, a power monitoring device (e.g., the first power monitoring device 402 and/or the second power monitoring device 404) may execute one or more operational tests, and may generate a status signal indicative of its operational state. The controller 408 may process the status signal and determine whether a fault has occurred in a power monitoring device. In some implementations, an operational test may be executed by a processor (e.g., 504, 514), a CPU (e.g., 508 516), and/or a communications interface (e.g., 506, 520). Some operational tests may include checking that data is not being stored in predetermined memory locations, such as read only areas. Other operational state tests may execute loopback tests to verify that data transmitted is substantially identical to the generated data. Yet other operational tests may include verifying the timely delivery of data, or performing a statistical analysis of generated power monitoring data. The statistical analysis of generated power monitoring data may include comparing the generated data to previously generated data stored in a memory. If an operational test fails, the CPU in communication with the failing device or component may generate a status signal indicating the failure. In other implementations the controller 408 may request at a periodic interval (e.g., about 1 second) operational information from a power monitoring device (e.g. polling). If a response is not received by the controller 408 within a determined time period, the controller 408 may determine that a fault has occurred in the non-responding power monitoring device. When a fault in a power monitoring device is detected, the corresponding power monitoring devices' CPU, or the controller 408, may store a timestamp in a memory indicating the time and/or date when the fault occurred. Other system parameters relating to the power monitoring device experiencing the fault may also be stored in memory. These other parameters may include the operation the power monitoring device was performing when the fault occurred, a recent history of executed power management functions and/or reporting algorithms, a last reset timestamp, software versions, firmware versions, error codes, and other parameters.

Figure 6:
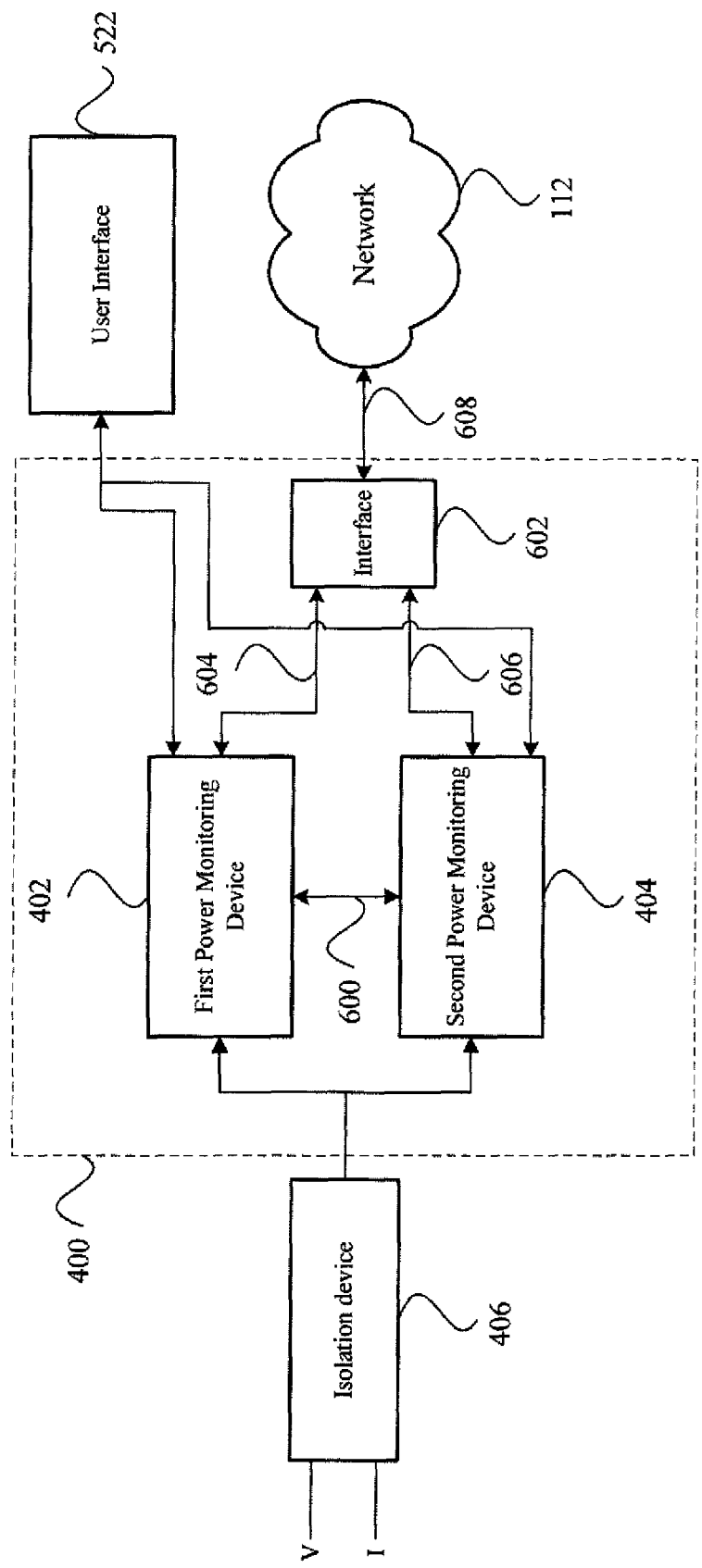
FIG. 6 is an alternate block diagram of a power meter having fault tolerance.

FIG. 6 is an alternate diagram of a power meter having fault tolerance. In FIG. 6, a first power monitoring device 402 and a second power monitoring device 404 receive approximately the same current and voltage inputs. The first power monitoring device 402 and the second power monitoring device 404 process the received inputs and perform power management functions and/or reporting algorithms. A communication line 600 connects the first power monitoring device 402 and the second power monitoring device 404. In some implementations, the communication line 600 is a full-duplex line that is data flows in both directions at once. Alternatively, the communication line 600 may include multiple lines connecting the first power monitoring device 402 and the second power monitoring device 404. Each of the multiple lines may permit data to flow in only one direction. That is one of the multiple lines may permit data to flow from the first power monitoring device 402 to the second power monitoring device 404, and another of the multiple lines may permit data to flow from the second power monitoring device 404 to the first power monitoring device 402.

The first power monitoring device 402 and the second power monitoring device 404 may communicate with a network 112 through an interface 602. Full duplex lines 604 and 606 may connect the interface 602 to the first power monitoring device 402 and the second power monitoring device 404, respectively. A full duplex line 608 may connect the interface 602 with the network 112. In some implementations, one or more of these lines may be an Ethernet, optical, or fiber connection. Alternatively, one or more of lines 600, 602, 604, and/or 608 may be half duplex lines. The lines 600, 602, 604, and/or 608 may be selected based upon a desired implementation.

Software executed by the power monitoring devices 402 and 404 may establish a primary-secondary relationship between the devices. In the primary-secondary relationship, the power monitoring device designated as the primary performs power management functions and/or reporting algorithms and transmits power management data to the network 112 while at the same time or at substantially same time, the secondary power monitoring device may perform the same power management functions and/or reporting algorithms or a different function/algorithm selected to obtain the same result as the primary power monitoring device. The output of the secondary power monitoring device may be stored in a memory and may be updated to substantially track the output generated by the primary power monitoring device. The output of the secondary power monitoring device may only be transmitted when power management data is not transmitted by the primary power monitoring device.

The secondary power monitoring device may request or receive the primary power monitoring device's status signal through communications line 600. When the status signal indicates that the primary power monitoring device is in a fault state, or it is otherwise unable to transmit power management data, the roles of the power monitoring devices may be reversed so that power management data generated by the secondary power monitoring device may be supplied to the network 112 without a substantial loss of data. That is, if the first power monitoring device 402 was the primary power monitoring device and the second power monitoring device 404 was the secondary power monitoring device, both the first power monitoring device 402 and the second power monitoring device 404 perform power management functions and/or reporting algorithms to obtain the same result. Power management data from the first power monitoring device 402 is transmitted to the network 112, while power management data from the second power monitoring device 404 may be stored in a memory. If a fault occurs at the first power monitoring device 402, the fault is reported to the second power monitoring device 404 through the first power monitoring device's status signal. The second power monitoring device 404 then becomes the primary, and it transmits the power management data that is not transmitted by the first power monitoring device 402 to the communications network 112. Because the second power monitoring device 404 performs in parallel a power management function and/or reporting algorithm, to obtain a similar result as that of the first power monitoring device, when the power monitoring devices switch transmission responsibilities there is substantially no loss or corruption of power monitoring data.

In some power meters having fault tolerance, the first power monitoring device 402 and the second power monitoring device 404 may be directly connected to a user interface 522. Software running on the power monitoring devices may determine which power monitoring device is the primary device and only allow communication with that device. In other power meters having fault tolerance, software processed by the user interface 522 may determine with which power monitoring devices the user interface 522 may communicate. In yet other power meters having fault tolerance, the user interface 522 may communicate with the power monitoring devices through a logic device that may control the communication path between the user interface 522 and the power monitoring devices.

Figure 7:
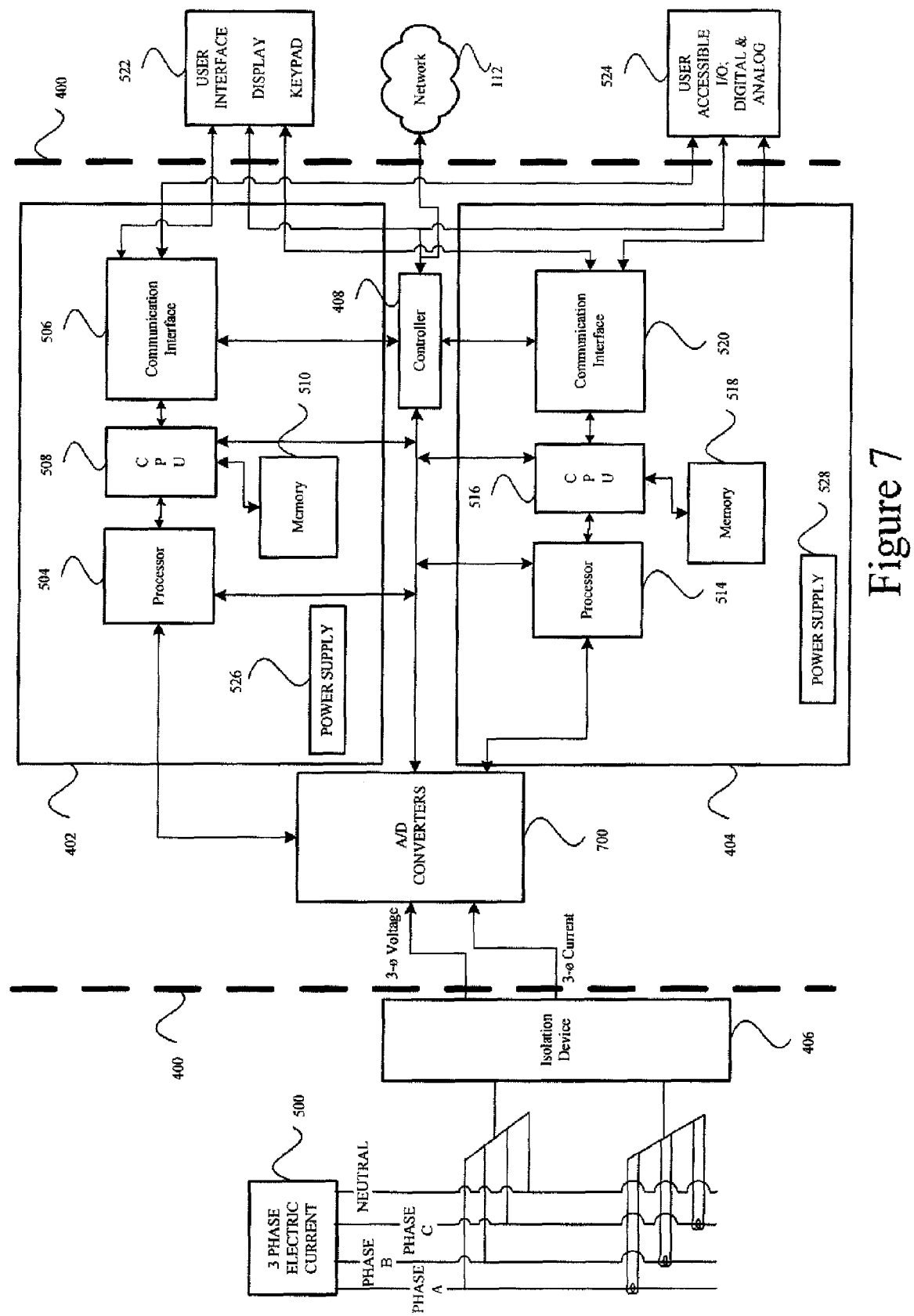
FIG. 7 is a second block diagram of the alternate power meter having fault tolerance.

FIG. 7 is a second alternate diagram of a power meter having fault tolerance. In FIG. 7, an A/D converter 700 receives the output of an isolation circuit 406. The A/D converter 700 may sample the current and voltage of the electrical circuit 500 and generate digital samples. The digital samples may be supplied to processors of different power monitoring devices (e.g., 504, 514). The use of a single A/D converter may eliminate variances present in a configuration using multiple A/D converters.

Figure 8:
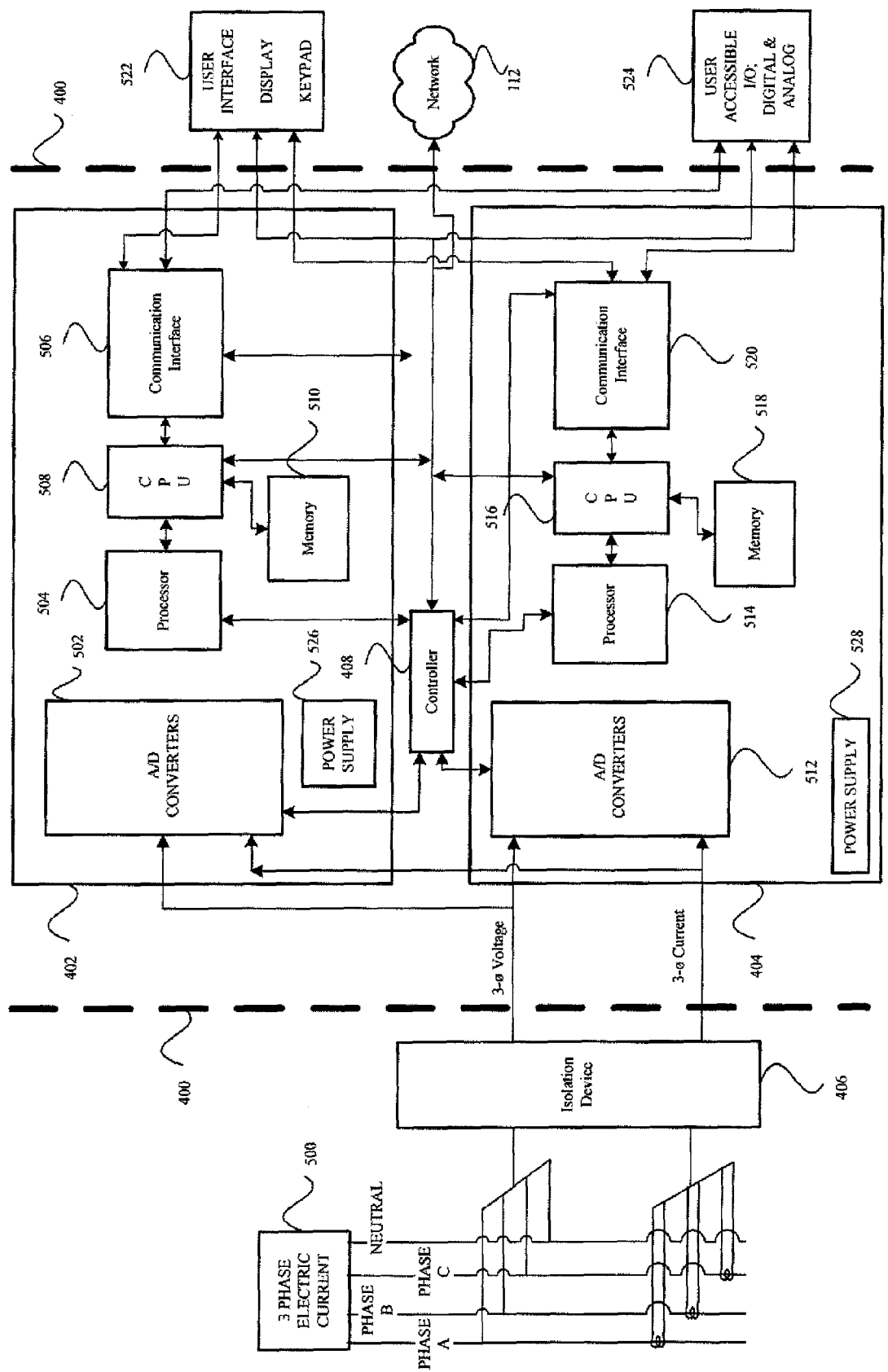
FIG. 8 is a third block diagram of the alternate power meter having fault tolerance.

FIG. 8 is a third alternate diagram of a power meter having fault tolerance. In FIG. 8, an isolation circuit may sense the current and voltage of an electrical circuit 500. The sensed current and voltage is supplied to an A/D converter of a first power monitoring device and an A/D converter of a second power monitoring device, 502 and 512, respectively. The A/D converters may sample the current and voltage and generate digital samples. The digital samples from the A/D converters may be supplied to the controller 408. The controller 408 may analyze the digital samples and select which digital samples are to be provided to the power monitoring device processors. Once the controller 408 selects which digital samples are to be used, the selected digital samples are provided to the power monitoring device processors. The controller 408 may select which digital samples are to be used by comparing the generated digital samples to prior generated digital samples stored in a memory or to a lookup or reference table stored in a memory.

The power monitoring devices of the fault tolerant meter 110 may include Programmable Logic Controllers ("PLC's"), remote Terminal Units ("RTU's"), electric power meters, protective relays, fault monitors, and other devices which may be in communication with or couple to a power distribution network to manage and control the distribution and consumption of power. These devices may include one or more volatile and/or non-volatile memories and one or more processors executing software to implement the desired power management functions. The power monitoring device may include on-site devices in communication with or coupled to particular loads or portions of an electrical distribution system. The power monitoring device may be used to monitor and/or manage power generation distribution, and consumption.

The PLC may be a solid-state control system that has a user-programmable memory that stores instructions to implement specific functions, such as Input/Output (I/O) control, logic, timing, counting, report generation, communication arithmetic, and data field manipulation. A PLC may include a processor, I/O interface, and memory.

The RTU is a field device installed on an electrical power distribution system at the desired point of metering. It may be equipped with input channels that may sense or meter, output channels that may be used for control, indication, and/or alarms, and a communication port. Metered information is typically available through a communication protocol having a serial communication port.

Although FIGS. 4-8 illustrate a first power monitoring device and a second power monitoring device, a power meter having fault tolerance may include additional power monitoring devices. The inclusion of additional power monitoring devices provides further fault tolerance and increases the time period for a user to replace a faulty power monitoring device. Although FIGS. 4-8 illustrate the first power monitoring device and second power monitoring device as being separate blocks, one or more of the components, units, and/or devices that comprise the power monitoring devices may be part of a unitary component, unit, and/or device. Moreover, while being implementation dependent, the redundant components of a power meter having fault tolerance include those components most likely prone to failure. The selection of which redundant components are provided is implementation dependent and may depend upon the application, empirical studies of component failures or other application specific data.

Figure 9:
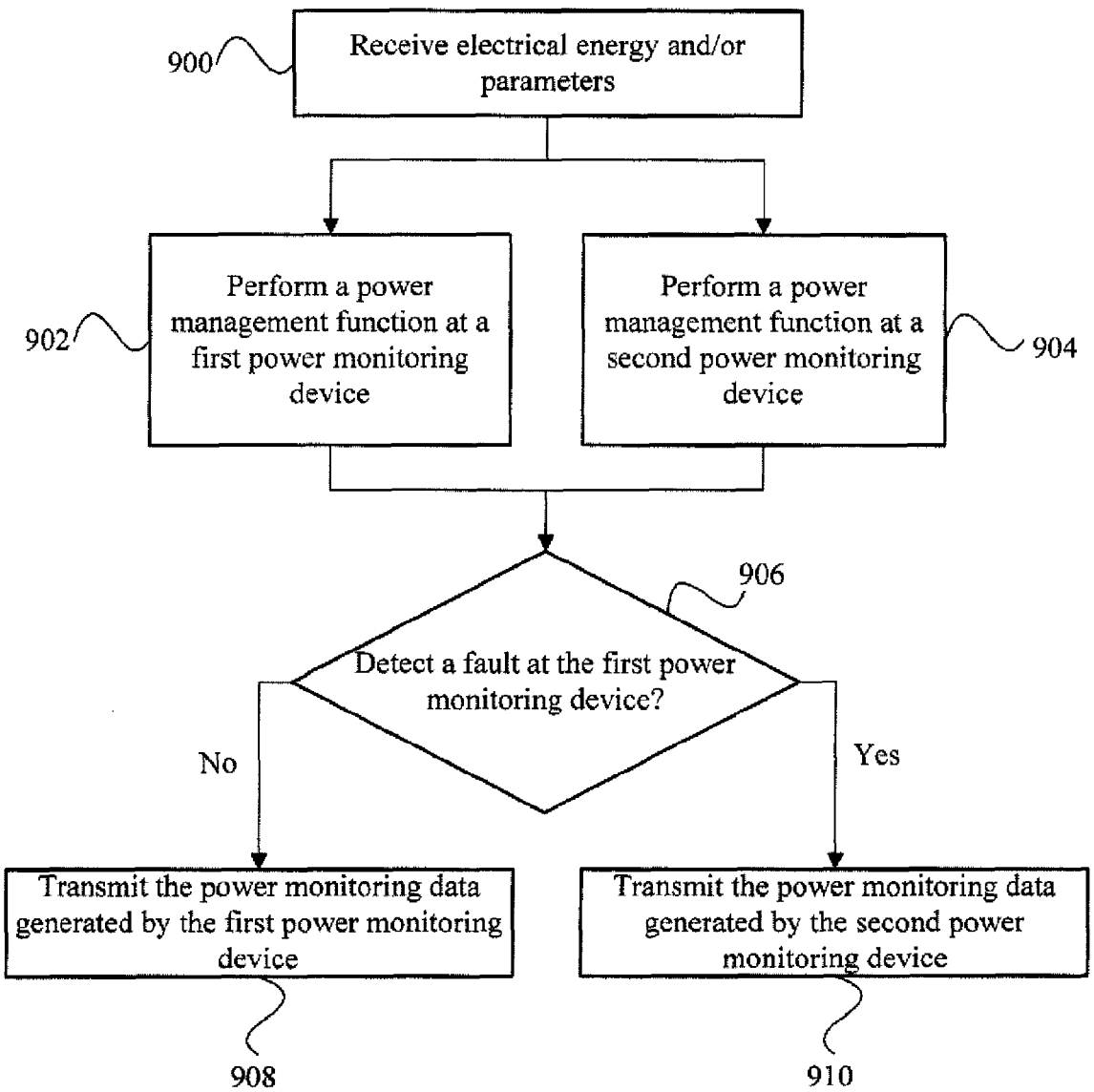
FIG. 9 is a method of providing fault tolerance to a power meter.

FIG. 9 is a method of providing fault tolerance to a power meter. At 900 a power meter having fault tolerance receives electrical energy and/or parameters. The received electrical energy and/or parameters may be received over a common line or multiple lines, and may be in an analog or digital format. In some methods, the format of the received electrical energy and/or parameters may be converted to analog and/or digital depending on a desired application. At 902 a first power monitoring device uses the received electrical energy and/or parameters and performs a power management function and/or reporting algorithm. The power management function and/or reporting algorithm may provide information for electrical providers and/or their customers and may be transmitted to a network while no fault is detected at the first power monitoring device. At the same time or substantially the same time that the first power monitoring device performs the power management function and/or reporting algorithm, a second power monitoring device uses the received electrical energy and/or parameters and performs a power management function and/or reporting algorithm at 904. The power management function and/or reporting algorithm performed by the second power monitoring device may be the same power monitoring function and/or algorithm performed by the first power monitoring device. Alternatively, the power management function and/or reporting algorithm performed by the second power monitoring device may be a different power monitoring function and/or reporting algorithm designed to obtain the same result as the power monitoring function and/or algorithm as the power monitoring function and/or algorithm performed by the first power monitoring device. At 906 a determination is made as to whether the first power monitoring device is in a fault status. The determination of the fault status may be performed by a controller that is in communication with the first power monitoring device and the second power monitoring device and that monitors the output of these devices. Alternatively, the fault status may be determined by a controller or another power monitoring device analyzing an operational status signal transmitted by the first power monitoring device. In some methods the operational status signal is generated by the first power monitoring device in response to one or more operational self tests. Some operational status signals include the time and/or date when the fault occurred, as well as other relevant data. A user interface that may include a display or other audio/visual indicators may display the operational status of the first power monitoring device.

If no fault exists at the first power monitoring device, the first power monitoring device may transmit its generated power management data at 908. If a fault exists at the first power monitoring device, then the second power monitoring device may transmit its generated power management data at 910 so that there is substantially no loss or corruption of data from the power meter.

In other methods, the second power monitoring device performs operational self tests, and generates operational status signals. The operational status signals generated by the second power monitoring device may be received by other power monitoring devices and/or controllers or processors. Additionally, operational status signals generated by the second power monitoring device may be received by the user interface and displayed through audio/visual indicators.

Each of the processes described may be encoded in a computer readable medium such as a memory, programmed within a device such as one or more integrated circuits, one or more processors or may be processed by a controller or a computer. If the processes are performed by software, the software may reside in a memory resident to or interfaced to a storage device, a communication interface, or non-volatile or volatile memory in communication with a transmitter. The memory may include an ordered listing of executable instructions for implementing logic. Logic or any system element described may be implemented through optic circuitry, digital circuitry, through source code, through analog circuitry, or through an analog source, such as through an electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any device that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

Although selected aspects, features, or components of the implementations are described as being stored in memories, all or part of the systems, including processes and/or instructions for performing processes, consistent with the system may be stored on, distributed across, or read from other machine-readable media, for example, secondary storage devices such as hard disks, floppy disks, and CD-ROMs; a signal received from a network; or other forms of ROM or RAM resident to a processor or a controller.

Specific components of a system may include additional or different components. A controller may be implemented as a microprocessor, microcontroller, application specific integrated circuit (ASIC), discrete logic, or a combination of other types of circuits or logic. Similarly, memories may be DRAM, SRAM, Flash, or other types of memory. Parameters (e.g., conditions), databases, and other data structures may be separately stored and managed, may be incorporated into a single memory or database, or may be logically and physically organized in many different ways. Programs and instruction sets may be parts of a single program, separate programs, or distributed across several memories and processors.

Through the use of a power monitoring device having fault tolerance, power management data may continue to be supplied to an electrical energy provider or its customers when a fault occurs at the power meter or the data processed by the power meter becomes corrupt. Additionally, when a fault occurs at a power meter having fault tolerance, the power meter may be serviced without having to take the power meter offline.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A power meter having fault tolerance, comprising:
a housing;
a first power monitoring device that performs a power management function and calculates first power management data, the first power monitoring device positioned within the housing;
a second power monitoring device that performs the power management function and calculates second power management data, the second power monitoring device positioned within the housing;
a controller in communication with the first power monitoring device through a first communication path, and with the second power monitoring device through a second communication path, where the first communication path and the second communication path do not share a common communication path; and a network connection in communication with the controller, where the controller is configured to receive the first power management data and the second power management data, and to selectively couple the first communication path or the second communication path to the network connection based on a corruption analysis of the first power management data and the second power management data and where the first power monitoring device and the second power monitoring device are configured to generate energy consumption data when the other of the first power monitoring device and the second power monitoring device is serviced.

2. The power meter of claim 1, where the first power monitoring device generates a fault signal indicative of an operating state of the first power monitoring device.

3. The power meter of claim 1, where the first power monitoring device is further configured to verify that the first power monitoring data transmitted to the controller is substantially identical to the calculated first power monitoring data.

4. The power meter of claim 1, further comprising a display that displays the operating state of the first power monitoring device.

5. The power meter of claim 1, where the second power monitoring device generates a fault status signal indicative of an operating state of the second power monitoring device.

6. The power meter of claim 1, further comprising a display that displays the operating state of the second power monitoring device.

7. The power meter of claim 1, where the second power monitoring device is in communication with the first power monitoring device, and where the second power monitoring device monitors a first power monitoring device status signal.

8. The power meter of claim 1, where a communication path between the controller and the network connection comprises a bi-directional transmission medium.

9. The power meter of claim 7, where the first power monitoring device transmits the first power monitoring device status signal at a periodic interval.

10. The power meter of claim 9, where the periodic interval comprises about one second.

11. A method of providing fault tolerance to a power meter, comprising:

receiving electrical data at an input of a single fault tolerant power meter;

performing a first power management function on the electrical data at a first power monitoring device to calculate first power management data;

performing a second power management function on the electrical data at a second power monitoring device to calculate second power management data;

detecting a fault status at the first power monitoring device based on a corruption analysis of the calculated first power management data; and transmitting from the second power monitoring device the second power management data when it is determined that the first power management data is corrupt, where the first power monitoring device and the second power monitoring device are configured to generate energy consumption data when the other of the first power monitoring device and the second power monitoring device is service.

12. The method of claim 11, where the act of detecting a fault at the first power monitoring device comprises receiving a fault status signal indicating the fault.

13. The method of claim 11, where the act of detecting a fault at the first power monitoring device comprises executing a loopback test at a communication device in communication with the first power monitoring device.

14. The method of claim 11, where the act of detecting a fault at the first power monitoring device comprises not receiving a response to a status query within a determined time period.

15. The method of claim 11, further comprising displaying an operational status of the first power monitoring device on a display.

16. The power meter of claim 1, where a corruption analysis comprises failing to receive the first power management data.

* * * * *

UNITED STATES PATENT AND TRADEMARK OFFICE
CERTIFICATE OF CORRECTION

| | | |
|---|---|---|
| PATENT NO. | : 8,493,231 B2 | Page 1 of 1 |
| APPLICATION NO. | : 11/851554 | |
| DATED | : July 23, 2013 | |
| INVENTOR(S) | : Michael E. Teachman | |

It is certified that error appears in the above-identified patent and that said Letters Patent is hereby corrected as shown below:

<u>In the Claims</u>

In column 12, claim 11, line 23, replace "is service" with --is serviced--.

Signed and Sealed this
Twenty-fourth Day of September, 2013

Teresa Stanek Rea
*Deputy Director of the United States Patent and Trademark Office*